United States Patent
Ebbers et al.

(10) Patent No.: US 8,043,909 B2
(45) Date of Patent: Oct. 25, 2011

(54) POROUS SEMICONDUCTIVE FILM AND PROCESS FOR ITS PRODUCTION

(75) Inventors: André Ebbers, Bochum (DE); Martin Trocha, Essen (DE); Robert Lechner, München (DE); Martin S. Brandt, Garching (DE); Martin Stutzmann, Erding (DE); Hartmut Wiggers, Reken (DE)

(73) Assignee: Evonik Degussa GmbH, Essen (DE)

( * ) Notice: Subject to any disclaimer, the term of this patent is extended or adjusted under 35 U.S.C. 154(b) by 831 days.

(21) Appl. No.: 12/053,369

(22) Filed: Mar. 21, 2008

(65) Prior Publication Data
US 2009/0026458 A1 Jan. 29, 2009

(30) Foreign Application Priority Data
Mar. 23, 2007 (DE) .......................... 10 2007 014 608

(51) Int. Cl.
*H01L 21/8238* (2006.01)
(52) U.S. Cl. .................. 438/223; 438/409; 438/960
(58) Field of Classification Search .................. 438/223, 438/409, 960
See application file for complete search history.

(56) References Cited

U.S. PATENT DOCUMENTS

| 5,139,624 | A  | * | 8/1992 | Searson et al. ............... 205/656 |
| 5,750,000 | A  | * | 5/1998 | Yonehara et al. ............. 438/459 |
| 6,326,279 | B1 | * | 12/2001 | Kakizaki et al. ............. 438/406 |
| 2002/0153595 | A1 | * | 10/2002 | Tayanaka ....................... 257/655 |
| 2005/0042743 | A1 | * | 2/2005 | Kawai et al. ............... 435/287.2 |
| 2007/0209696 | A1 | * | 9/2007 | Duerr et al. .................. 136/252 |

* cited by examiner

*Primary Examiner* — Douglas Menz
(74) *Attorney, Agent, or Firm* — Oblon, Spivak, McClelland, Maier & Neustadt, L.L.P.

(57) ABSTRACT

The present invention provides a porous semiconductive structure, characterized in that the structure has an electrical conductivity of $5 \cdot 10^{-8}$ S·cm$^{-1}$ to 10 S·cm$^{-1}$, and an activation energy of the electrical conductivity of 0.1 to 700 meV, and a solid fraction of 30 to 60% by volume, and a pore size of 1 nm to 500 nm, the solid fraction having at least partly crystalline doped constituents which are bonded to one another via sinter necks and have sizes of 5 nm to 500 nm and a spherical and/or ellipsoidal shape, which comprise the elements silicon, germanium or an alloy of these elements, and also a process for producing a porous semiconductive structure, characterized in that A. doped semimetal particles are obtained, and then
B. a dispersion is obtained from the semimetal particles obtained after step A, and then
C. a substrate is coated with the dispersion obtained after step B, and then
D. the layer obtained after step C is treated by means of a solution of hydrogen fluoride in water, and then
E. the layer obtained after step D is treated thermally to obtain a porous semiconductive structure.

13 Claims, 6 Drawing Sheets

Figure 3:
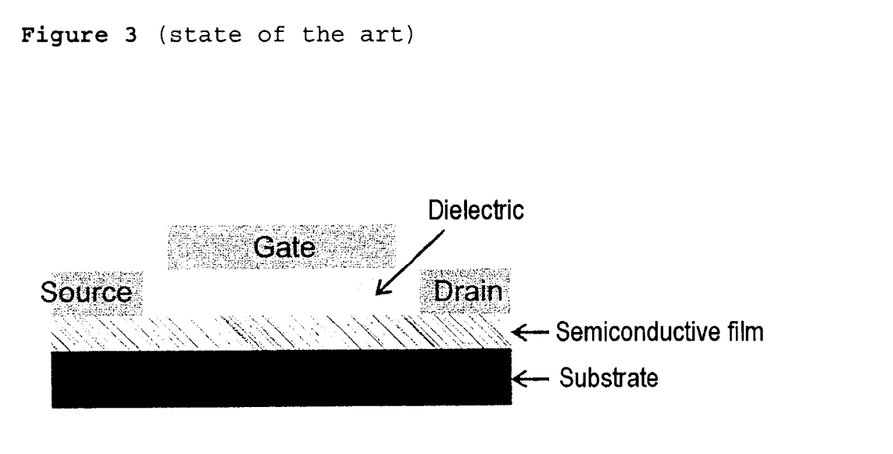

Figure 3 (state of the art)

Figure 4

Figure 5

Figure 6:
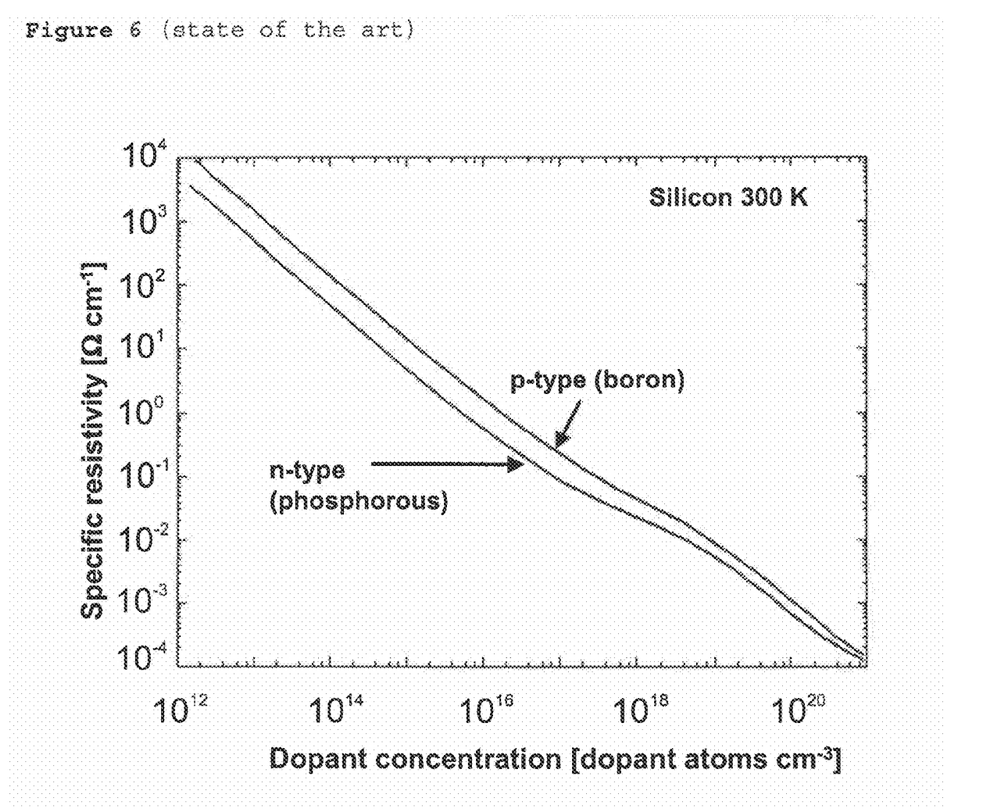

Figure 6 (state of the art)

POROUS SEMICONDUCTIVE FILM AND PROCESS FOR ITS PRODUCTION

CROSS REFERENCES TO RELATED APPLICATIONS

This application claims priority to German Patent Application No. 10 2007 014 608.8 filed on Mar. 23, 2007, the entire contents of which is incorporated herein by reference.

DISCLOSURE OF THE INVENTION

The invention described below relates to a porous semiconductive structure and to a process for its production.

The prior art discloses semiconductive layers and field-effect transistors produced therefrom, which have particles from the group of the semiconductor compounds CdSe, CdTe, CdS, ZnS or ZnO. These are applied on a substrate from a dispersion or suspension. The problem of the environmental hazard associated with the use of such heavy metal compounds and their allergenic, irritant or even toxic effects on humans have likewise been known for some time and constitute an obstacle, which is being taken ever more seriously, to the economic utilization of such materials.

Talapin in "*Science*", 310, p. 86 (2005), discloses transistors consisting of PbSe, CdSe. Cadmium and its compounds are classified as "toxic" or "very toxic". Moreover, there is well-founded suspicion of a carcinogenic effect on humans. Inhaled cadium-containing dust leads to damage to the lung, liver and kidney. PbTe, PbS and PbSe are likewise toxic. Use of these materials in printed electronics is therefore inadvisable. Silicon, in contrast, is a non-toxic substance. The systems described in Talapin were modified in a complicated manner by chemical treatment steps. The functioning of the components constructed was highly dependent on the arrangement of the particles, whose distances between one another are within the range of below one nanometer.

Sun in "*Nano Letters*", 5, p. 2408 (2005) discloses transistors composed of particulate ZnO. ZnO, in contrast to silicon, has the crucial disadvantage that it is not possible at the present state of the art to carry out both p- and n-doping to obtain both hole-conducting and electron-conducting structures. Although it has been possible to produce the first p-conductive layers and pn junctions from ZnO, a high, homogeneous, reproducible and stable p-doping is still far away (Klingshirn in "*Physik Journal*", 5, No. 1 (2006)).

The use of silicon or germanium as a semiconductor material and the provision of electronic components from these materials requires a high degree of purity of these semimetals, and also doping which has to be maintained exactly, and, owing to the requirement in the prior art for macroscopic crystallinity, very complicated production processes for wafers in order to be able to control the desired semiconductor properties, especially in the production of miniaturized circuits.

Silicon or germanium is significantly easier to produce industrially in the form of particles. Roth et al., *Chem. Eng. Technol.* 24 (2001), 3, disclose the production of particulate silicon from the gas phase. The possibility of obtaining doped particulate silicon is disclosed in DE 10 353 996, the silicon powder having a BET surface area of more than 20 $m^2 \cdot g^{-1}$ However, such particles composed of silicon and also germanium have defects composed of transition metals, as is likewise known in the literature and is discussed, for example, in Sze in "*Physics of Semiconductor Devices*", John Wiley and Sons, 1981. Furthermore, silicon, for example, has deep defects which are attributable to surface states. Such surface states can in principle be passivated by specific processes, for example by means of hydrogen treatment and/or functionalization. EP 000001760045A1 discloses that such processes are applicable to silicon particles in order to significantly reduce the number of surface defects. For layers composed of silicon particles, which are disclosed, for example, in DE 10 2005 022383, these processes are only of limited utility and do not lead to a significant reduction in the defect concentration. The conductivity is limited by these surface defects, which prevents the usability of these layers for electronic applications.

Volker Lehmann states, in "*Electrochemistry of Silicon*", ISBN 3-527-29321-3, Wiley-VCH Weinheim 2002, that surface defects in porous silicon adversely affect the conductivity of a porous semiconductive layer, by virtue of these defects capturing charge carriers. What is disclosed is a porous silicon having a BET surface area of 43 $m^2 \cdot g^{-1}$, which has been produced by electrochemical etching. The specific resistivity is from $10^4$ to $10^7$ $\Omega \cdot cm$, which is too high for electronic applications. Another disadvantage of this material is the production route. Such a material is produced from crystalline wafer silicon in a costly and process-intensive manner.

Material produced from porous silicon is thus usable only in a very restricted way, if at all, for electronic applications.

It is also known from the prior art that there is a connection between the concentration of dopants and the conductivity in monocrystalline semiconductors and volume semiconductors. Moreover, the person skilled in the art gains information about the density of free charge carriers in a voluminous semiconductor via the activation of the dopants. This density is modulated, for example, in a field-effect transistor by the influence of an external electrical field. The density has to be adjusted in a controlled manner via the doping. Moreover, high demands are made on the crystalline purity of the carrier material.

It was therefore an object of the present invention to provide semiconductive structures based on the semimetals silicon, germanium or silicon-germanium alloys, which overcome one or more disadvantages of the prior art.

It has been found that, surprisingly, this object is achieved by a semiconductive structure which is characterized in that the structure has an electrical conductivity of $5 \cdot 10^{-8}$ $S \cdot cm^{-1}$ to 10 $S \cdot cm^{-1}$, and an activation energy of the electrical conductivity of 0.1 to 700 meV, and a solid fraction of 30 to 60% by volume, and a pore size of 1 nm to 500 nm, the solid fraction having at least partly crystalline doped constituents which are bonded to one another via sinter necks and have sizes of 5 nm to 500 nm and a spherical and/or ellipsoidal shape, which comprise the elements silicon, germanium or an alloy of these elements.

In the context of the present invention, the pore size is determined in a scanning electron micrograph (SEM) in 80 000-fold magnification. The activation energy was obtained by means known to those skilled in the art from temperature-dependent measurements of the electrical conductivity.

The advantage of the present invention consists in the fact that the inventive structure can be provided in areas of any size in a simple manner which is undemanding in apparatus terms, and significantly fewer high requirements have to be made on the crystallinity of the constituents than is the case for structures for prior art electronic components. A further advantage of the present invention is that the inventive porous semiconductive structure does not contain a binder. Binders are substances which do not consist of the semiconductive material and fill gaps between the semiconductive material and bond the particles mechanically. More particularly, the inventive structure does not contain an inert binder. Inert binders are those which are themselves not semiconductors or conductors in the definition known to those skilled in the art.

The present invention thus provides a porous semiconductive structure characterized in that the structure has an electrical conductivity of $5 \cdot 10^{-8}$ S·cm$^{-1}$ to 10 S·cm$^{-1}$, and an activation energy of the electrical conductivity of 0.1 to 700 meV, and a solid fraction of 30 to 60% by volume, and a pore size of 1 nm to 500 nm, the solid fraction having at least partly crystalline doped constituents which are bonded to one another via sinter necks and have sizes of 5 nm to 500 nm and a spherical and/or ellipsoidal shape, which comprise the elements silicon, germanium or an alloy of these elements.

The inventive structure has, by virtue of the constituents bonded to one another via sinter necks, an electrically percolating network whose electrical conductivity can be adjusted by the doping of the semiconductive constituents.

The present invention further provides a process for producing a porous semiconductive structure, characterized in that
  A. doped semimetal particles are obtained, and then
  B. a dispersion is obtained from the semimetal particles obtained after step A, and then
  C. a substrate is coated with the dispersion obtained after step B, and then
  D. the layer obtained after step C is treated by means of a solution of hydrogen fluoride in water, and then
  E. the layer obtained after step D is treated thermally to obtain a porous semiconductive structure.

One advantage of the process according to the invention is the production of inventive structures from the dispersion by inexpensive coating and printing processes.

The present invention further provides a porous semiconductive structure which is obtained by the process according to the invention.

The present invention also has the advantage that, by means of the inventive structure, a current flowing between two electrodes can be regulated by a control electrode. Power-conducting constructions known to those skilled in the art can be provided in a simple manner with the inventive structure.

The present invention therefore also provides an electronic component comprising the inventive porous semiconductive structure.

The present invention thus further provides a field-effect transistor comprising the inventive electronic component.

The present invention likewise provides a Peltier element comprising the inventive electronic component.

The invention further provides a thermal power element comprising the inventive electronic component.

The present invention further provides a gas sensor comprising the inventive electronic component.

The present invention further provides a microelectromechanical sensor comprising the inventive electronic component.

The present invention further provides a diode comprising the inventive electronic component.

The present invention further provides a photodiode comprising the inventive electronic component.

The present invention further provides a thermal power element comprising the inventive electronic component.

The subject-matter of the present invention will be described by way of example hereinafter, without any intention that the invention, whose scope of protection is evident from the claims and the description, be restricted thereto.

The present invention provides a porous semiconductive structure characterized in that the structure has an electrical conductivity of $5 \cdot 10^{-8}$ S·cm$^{-1}$ to 10 S·cm$^{-1}$, and an activation energy of the electrical conductivity of 0.1 to 700 meV, and a solid fraction of 30 to 60% by volume, and a pore size of 1 nm to 500 nm, the solid fraction having at least partly crystalline doped constituents which are bonded to one another via sinter necks and have sizes of 5 nm to 500 nm and a spherical and/or ellipsoidal shape, which comprise the elements silicon, germanium or an alloy of these elements.

It may be advantageous when the inventive structure has a pore size of 5 to 100 nm. It may also be advantageous when the inventive structure has an activation energy of the electrical conductivity of 5 meV to 250 meV, more preferably of 10 to 50 meV. The constituents of the inventive structure preferably comprise, as a solid fraction, at least partly crystalline semiconductive material, more preferably silicon.

It may be advantageous when the constituents of the inventive structure are partly bonded to one another. These compounds may preferably have mainly sinter bridges. The interior of the sinter bridges of the inventive structure preferably consists mainly, but not exclusively, of a semiconductive material. More preferably, the crystalline construction of the constituent continues within the sinter bridge, without there being a crystallographic dislocation or particle boundary.

It may be advantageous when the constituents of the inventive structure contain, at least in part, corners and recesses.

Optionally, the surface of the constituents of the inventive structure may at least partly contain further elements. These elements may more preferably be oxygen, hydrogen and/or carbon. Optionally, the surface of the sinter bridges of the inventive structure may at least partly contain further chemical elements. More preferably, these elements may be oxygen, hydrogen and/or carbon. Optionally, the compounds between two constituents each of the inventive structure may contain further elements in addition to the semiconductive element. More preferably, these elements may be oxygen, hydrogen and/or carbon. The surfaces of the constituents of the inventive structure preferably have SiO$_x$, Si—H, Si—OH groups, and/or adsorbates of carbon.

It may also be advantageous when the constituents of the inventive structure, which have sizes of 100 to 500 nm, and the constituents which have sizes below 100 nm, on a size scale of 2 µm to 10 µm, are mixed with one another on and in the inventive structure. More preferably, the inventive structure, on a size scale below 2 µm, may have constituents of 100 nm to 500 nm in size on and in the inventive structure. Moreover, more preferably, the inventive structure, on the surface of the constituents which have a size of 100 nm to 500 nm, may have constituents which have a size of 5 to 100 nm, preferably of 5 to 90 nm, more preferably of 5 to 80 nm, most preferably of 5 to 50 nm.

The inventive structure may have a BET surface area of 10 to 500 m$^2$·g$^{-1}$. The inventive structure may preferably have the BET surface area of the semimetal particles from which the inventive structure has been obtained in the process according to the invention. More preferably, the BET surface area of the inventive structure may be 10 to 100 m$^2$·g$^{-1}$, even more preferably 50 to 100 m$^2$·g$^{-1}$, most preferably 10 to 50 m$^2$·g$^{-1}$.

The inventive structure may preferably have a thickness of 20 nm to 5 µm, more preferably of 50 nm to 5 µm, most preferably of 50 nm to 3 µm.

The present invention likewise provides a process for producing a porous semiconductive structure, characterized in that
  A. doped semimetal particles are obtained, and then
  B. a dispersion is obtained from the semimetal particles obtained after step A, and then C. a substrate is coated with the dispersion obtained after step B, and then D. the layer obtained after step C is treated by means of a solution of hydrogen fluoride in water, and then E. the layer obtained after step D is treated thermally to obtain a porous semiconductive structure.

It may be advantageous when, in the process according to the invention, in step A, continuously, (a) at least one vaporous or gaseous semimetal hydride selected from silane, germanium hydride and a mixture of these semimetal hydrides and at least one vaporous or gaseous dopant, and an inert gas are transferred into a reactor and mixed there, the proportion of the semimetal hydride being from 0.1% to 90% by weight based on the sum of semimetal hydride, dopant and inert gas, and then (b) a plasma is obtained by energy input by means of electromagnetic radiation in the microwave range at a pressure of 10 to 1100 hPa, and then (c) the reaction mixture is allowed to cool, and the reaction product is removed from gaseous substances in the form of a powder to obtain predominantly crystalline doped semimetal particles. Preferably, in the process according to the invention, the proportion of the dopant may be 1 ppm to 30 000 ppm based on the sum of semimetal hydride and dopant.

In the process according to the invention, silane can preferably be used to produce the semimetal particles, disclosed in DE 10 353 996. The semimetal particles preferably have chemical impurities which, in their overall concentration, may be below 100 ppm, preferably below 20 ppm and more preferably below 5 ppm. In this context "impurity" denotes all atom types which are not part of the pure semiconductor and are not used as a dopant.

It may also be advantageous, more preferably for the application as a switchable channel in field-effect components, when doped semimetal particles which have a dopant concentration of $10^{18}$ dopant atoms $cm^{-3}$ to $5 \cdot 10^{18}$ dopant atoms $cm^{-3}$ are used in the process according to the invention. It may also be advantageous, more preferably for the application in thermal power components, when doped semimetal particles which have a dopant concentration of $10^{19}$ dopant atoms $cm^{-3}$ to $10^{20}$ dopant atoms $cm^{-3}$ are used in the process according to the invention.

It may also be advantageous, more preferably for the application as source and drain contacts in field-effect components, when doped semimetal particles which have a dopant concentration of $10^{20}$ dopant atoms $cm^{-3}$ to $10^{21}$ dopant atoms $cm^{-3}$ are used in the process according to the invention. The measurement of the dopant concentration is known to those skilled in the art and is effected by electron spin resonance or electro-paramagnetic resonance, corona-discharge mass spectroscopy, or by mass spectroscopy on inductively coupled plasmas or conductivity measurements on samples which have been obtained by melting. The dopant concentrations provided in the prior art are disclosed, for example, in DE 10 353 996 and in DE 10 2005 022383.

In the process according to the invention, it may be advantageous when, in step (a), a dopant is used which is selected from lithium metal and lithium metal amide (LiNH$_2$), from the group of hydrogen-containing compounds of phosphorus, arsenic, antimony, bismuth, boron, aluminium, gallium, indium, thallium, europium, erbium, cerium, praseodymium, neodymium, samarium, gadolinium, terbium, dysprosium, holmium, thulium, ytterbium, lutetium, lithium, germanium, iron, ruthenium, osmium, cobalt, rhodium, iridium, nickel, palladium, platinum, copper, silver, gold, zinc, and from a mixture of these dopants. More preferably, in the process according to the invention, a dopant may be used which is selected from phosphorus, arsenic, antimony, bismuth, boron, aluminium, gallium, indium, most preferably selected from boron, phosphorus and aluminium.

It may also be advantageous in the process according to the invention when, in step B, doped semimetal particles are used with a proportion by mass of 1 to 60% by weight based on the total mass of the dispersion, and the doped semimetal particles are dispersed into a liquid phase which comprises or consists of water and/or at least one organic solvent to obtain a dispersion which, at 23° C., has a viscosity of less than 100 mPas, more preferably of less than 10 mPas, at 1000 s$^{-1}$. The features of the dispersion which can be used in the process according to the invention and features of the process for producing such dispersions are disclosed, for example, in DE 10 2005 022383.

Preferably, in step C of the process according to the invention, the dispersion is applied to the substrate by spin-coating, knife-coating, drip-coating, screen-printing, dip-coating and spray-coating, and then the liquid phase is driven out by introducing thermal energy to obtain a layer which has a conductivity of at most $10^{-11}$ S·cm$^{-1}$. More preferably, in step C of the process according to the invention, the liquid phase is driven out in an oven or under hot inert gas.

This procedure has the advantage that a coating can be obtained which, irrespective of the doping of the particles used, has a conductivity below less than $10^{-11}$ S·cm$^{-1}$. The conductivity is measured by processes known to those skilled in the art.

Advantageously, in the process according to the invention, a substrate is used which is selected from organic, inorganic material, and a composite composed of at least one organic and/or at least one inorganic material, the substrate being resistant to hydrofluoric acid. Preferably, in the process according to the invention, a substrate may be used which has a total thickness below 1 cm, more preferably below 1 mm, most preferably below 0.4 mm. In the context of the present invention, a resistant substrate is understood to mean a substrate which, in step D of the process according to the invention, is neither dissolved, etched nor damaged.

Preferably, in the process according to the invention, a substrate is used which is selected from the materials sapphire, glass, quartz and ceramics, diamond applied by chemical gas phase deposition on a carrier selected from glass, quartz and ceramics, or is selected from polymers, more preferably selected from polyethylene terephthalate, polyimide, polyvinyl chloride, polystyrene, polyamide, polyetheretherketone (PEEK), polypropylene, polyethylene, polymethyl methacrylate (PMMA), and a combination of these substrates. Exceptionally preferably, in the process according to the invention, a substrate can be used which is selected from polymer films selected from polyethylene terephthalate, polyimide, polyvinyl chloride, polystyrene, polyamide, polyetheretherketone (PEEK), polypropylene, polyethylene, polymethyl methacrylate (PMMA), and a combination of these substrates.

In the process according to the invention, it may be advantageous when in step D, a solution of hydrogen fluoride in water in a concentration of the hydrogen fluoride of 0.01% by weight to 50% by weight, based on the total mass of the solution of hydrogen fluoride in water, is applied by dipping, drip-coating, spray-coating or flow-coating, and is applied at a temperature of 10° C. to 70° C. and over a period of 1 s to 1 hour to obtain a layer which has an electrical conductivity of $5 \cdot 10^{-11}$ S·cm$^{-1}$ to $2 \cdot 10^{-10}$ S·cm$^{-1}$.

More preferably, in the process according to the invention, in step D, a solution of hydrogen fluoride in water is used in a concentration of the hydrogen fluoride of from 1 to 30% by weight, most preferably from 5 to 15% by weight, and at a temperature preferably from 15° C. to 40° C., more preferably from 18° C. to 30° C., and over a duration preferably from 5 s to 5 minutes, more preferably from 10 s to 60 s.

It may also be advantageous when, in the process according to the invention, the layer obtained after step D, in a further step D2 before step E, is dipped or rinsed off in water and then blown with dry nitrogen, or then dried at a temperature of 60 to 200° C.

In the process according to the invention, the thermal treatment can preferably be effected in step E by introduction of thermal energy, more preferably by absorption of light energy, most preferably by absorption of light from a flash lamp, with a power density of 10 kW·cm$^{-2}$ to 65 MW·cm$^{-2}$, which at least partly sinters the particles of the layer obtained after step D.

Preferably, in the process according to the invention, the input of thermal energy is effected by means of laser light having a wavelength of 500 to 1100 nm, more preferably of 505 to 850 nm, especially preferably of 510 to 650 nm, most preferably of 530 to 600 nm, the thermal energy being introducible with an energy density of 1 mJ·cm$^{-2}$ to 500 mJ·cm$^{-2}$, and, if pulsed laser light is used, this laser light being used with a pulse duration of 8 ns to 20 ns and a number of 10 to 30 pulses at a pulse repetition rate of 0.01·s$^{-1}$ to 10·s$^{-1}$ with a pulse sequence which consists of 10 to 30 pulses of rising energy density, beginning at an energy density of 10 mJ cm$^{-2}$ to 30 mJ cm$^{-2}$ and rising up to an energy density of 60 mJ cm$^{-2}$ to 120 mJ cm$^{-2}$. The maximum energy density introduced in this way significantly determines the properties of the layer. The energy density accumulated with the pulses is thus 400 mJ cm$^{-2}$ to 5000 mJ cm$^{-2}$.

More preferably, in the process according to the invention, the input of thermal energy can be effected by means of laser light having an energy density of 20 to 100 mJ·cm$^{-2}$. Exceptionally preferably, in the process according to the invention, the thermal energy can be introduced by an Nd:YAG laser with the wavelength of 532 nm. Most preferably, the thermal energy can be supplied until the layer obtained after step D of the process according to the invention sinters.

The process according to the invention affords inventive porous semiconductive structures.

The figures which follow are intended to illustrate the inventive structure in detail, without any intention that the present invention be restricted to these embodiments.

Figure 1:
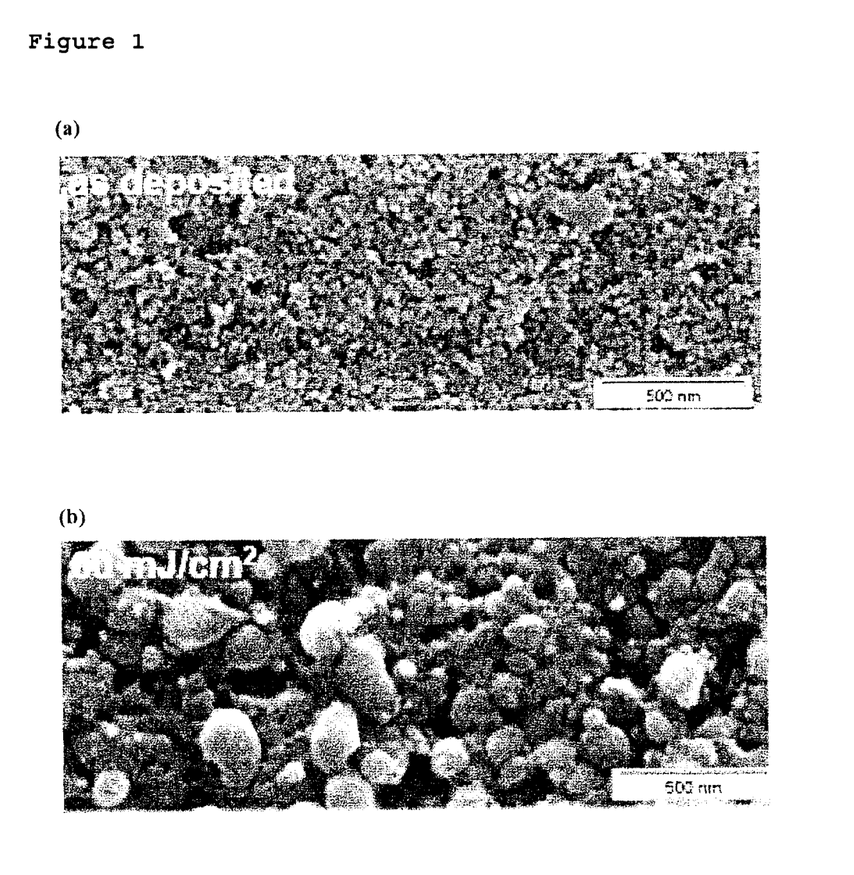

FIG. 1 shows, in the scanning electron micrograph (a), which is labelled "as deposited", an image of a layer of doped silicon particles on polyimide film, which has been obtained after step D and before step E of the process according to the invention.

The scanning electron micrograph (b) labelled "60 mJ·cm$^{-2}$" shows the inventive structure which has been obtained after step E of the process according to the invention at a pulse energy density of 60 mJ·cm$^{-2}$ and the input of thermal energy by means of an Nd:YAG laser at a wavelength of 532 nm.

Figure 2:
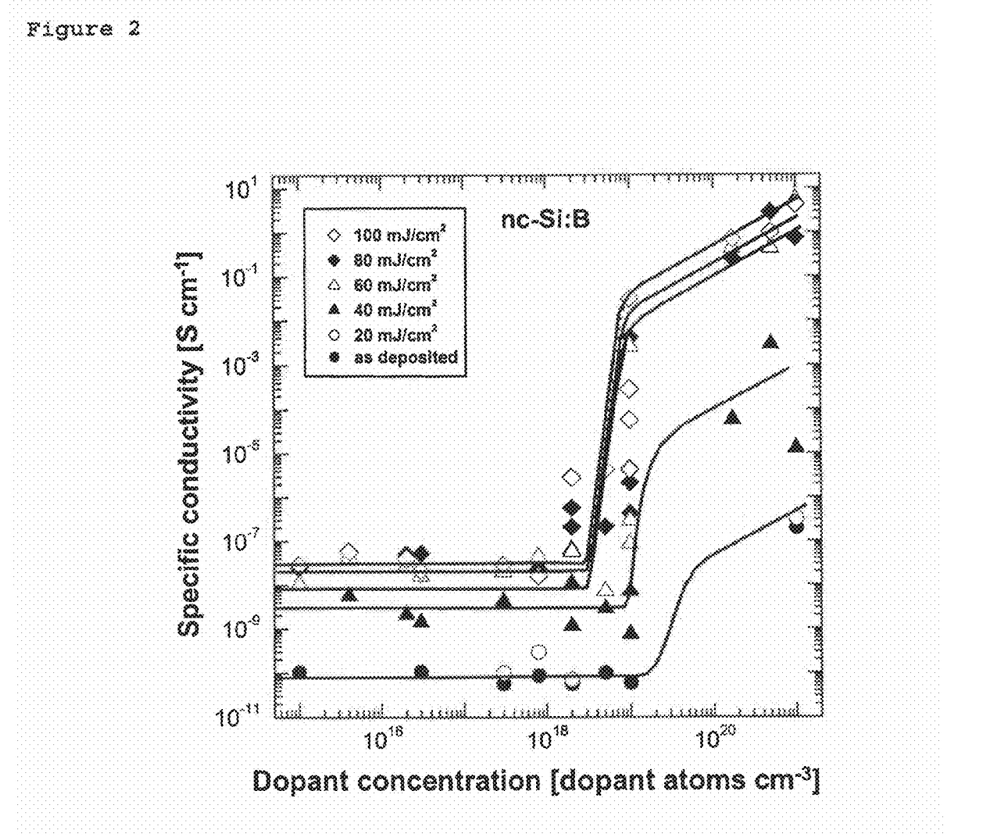

FIG. 2 shows the conductivity of the inventive structure which has been obtained from silicon particles after step E of the process according to the invention as a function of the dopant concentration with boron as a dopant and various energy densities on introduction of thermal energy by means of an Nd:YAG laser which has been used in step E of the process according to the invention.

The dopant used was boron. The solid fraction was 40% by volume, the mean pore size 180 nm, the activation energy of the electrical conductivity 25 meV.

The conductivity rose above the energy density of 60 mJ·cm$^{-2}$ and saturated at 120 mJ/cm$^2$.

The conductivity initially remained small and constant when the dopant concentration was increased. From a threshold concentration, the conductivity rose by about 3 orders of magnitude and rose in a linear manner beyond this threshold concentration. The threshold concentration depended only weakly on the laser energy density used, and shifted to smaller threshold concentrations with increasing laser energy density.

The non-linear relationship between the conductivity and the dopant concentration of the inventive structure is a further surprising feature which is in contrast to the behaviour of prior art semiconductors.

The dopant concentration can be established in the region of the threshold concentration in the course of production of the particles, which particularly advantageously affords field-effect transistors which are characterized by steep characteristics and a high on/off ratio of up to 8 orders of magnitude.

FIG. 3 (prior art) shows a schematic structure of a field-effect transistor (FET).

Figure 4:
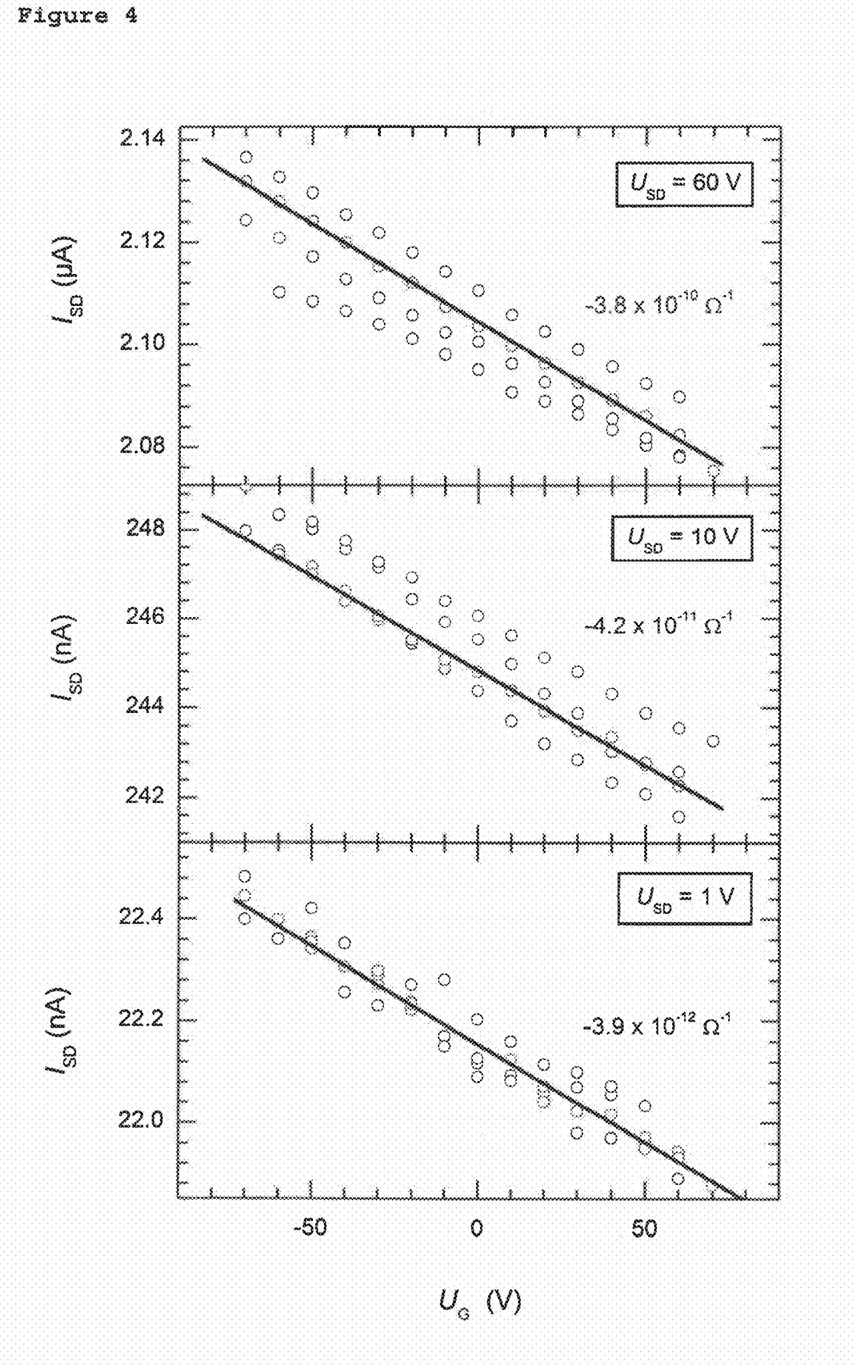

FIG. 4 shows the characteristic of an FET which has the inventive structure composed of silicon particles sintered by the process according to the invention. The solid content was 40% by volume, the pore size 180 nm, the activation energy of the electrical conductivity 25 meV.

The dielectric used was PMMA, and the substrate a polyimide film. The source-drain contacts were applied by vapour deposition. The dopant used was boron and, after the process according to the invention had been performed, a dopant concentration of $10^{19}$ cm$^{-3}$ was measured.

The source-drain current is shown as a function of the gate voltage for three different source-drain voltages $U_{SD}$. The currents rise with rising source-drain voltage. With rising gate voltage, fewer holes were accumulated at the gate and the source-drain current fell.

Figure 5:
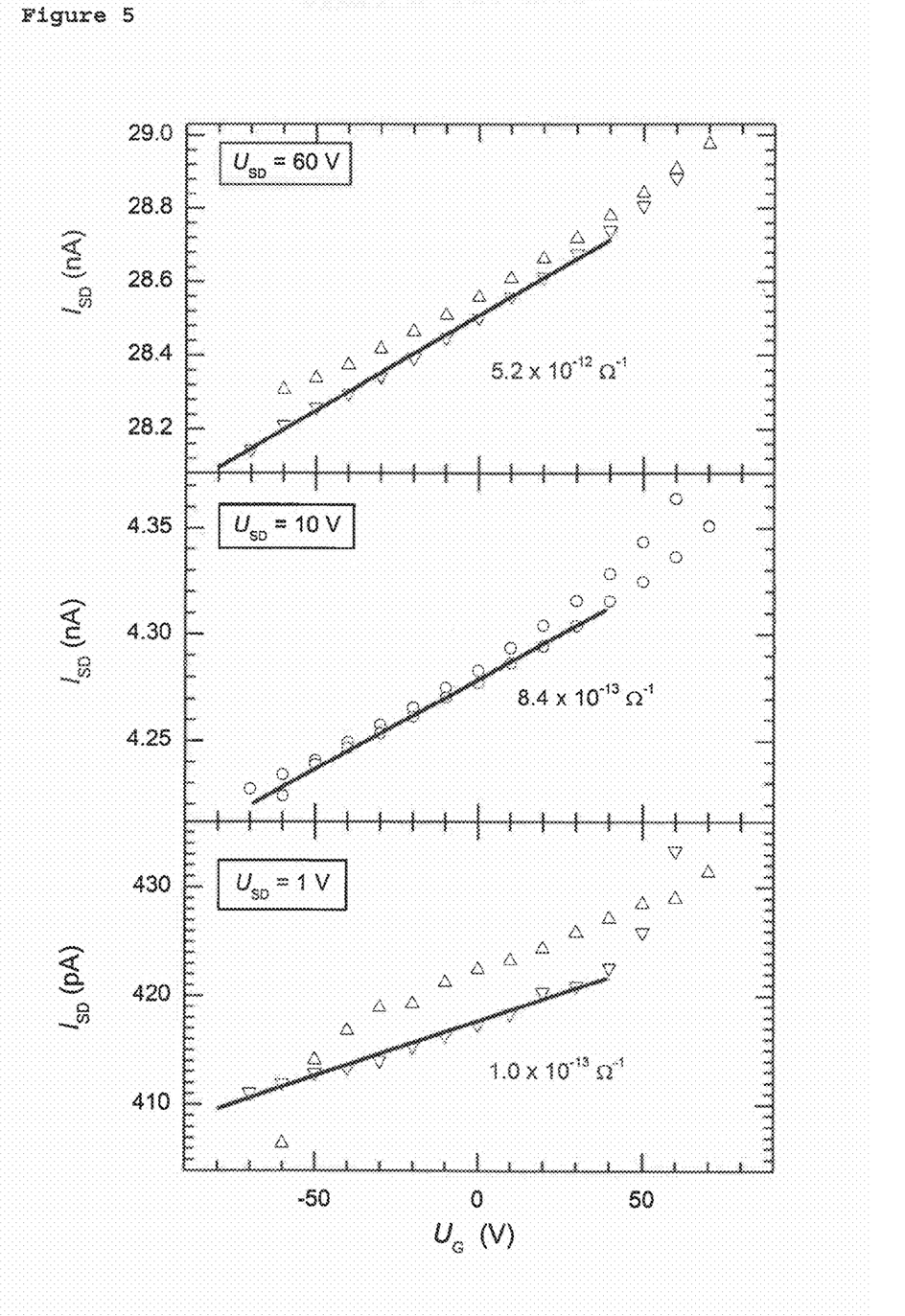

FIG. 5 shows the characteristic of an FET which has the inventive structure composed of silicon particles sintered by the process according to the invention.

The solid content is 40% by volume, the pore size 180 nm.

The dielectric used was PMMA, and the substrate a polyimide film. The source-drain contacts were applied by vapour deposition. The dopant used was phosphorus, and the dopant concentration was adjusted to $5 \cdot 10^{19}$ cm$^{-3}$.

The source-drain current is shown as a function of the gate voltage for three different source-drain voltages $U_{SD}$. The currents rise with rising source-drain voltage. With rising gate voltage, more electrons were accumulated at the gate and the source-drain current rose.

FIG. 6 (prior art) shows the specific resistivity as a function of the dopant concentration of bulk silicon which had been doped with the dopant boron or phosphorus and was known in the prior art. The figure was taken from the article by Sze from "*Physics of Semiconductor Devices*, John Wiley and Sons, 1981". The specific resistivity is the reciprocal of the specific conductivity.

In contrast to the behaviour of the inventive structure, the boron- or phosphorus-doped bulk silicon exhibits a uniform decrease in the resistance with the dopant concentration. No non-linear relationship occurred between the conductivity and the dopant concentration.

The invention claimed is:
1. A process for producing a porous semiconductive structure, wherein
   A. doped semimetal particles are obtained, and then
   B. a dispersion is obtained from the semimetal particles obtained after step A, and then
   C. a substrate is coated with the dispersion obtained after step B, and then

D. the layer obtained after step C is treated by means of a solution of hydrogen fluoride in water, and then E. the layer obtained after step D is treated thermally to obtain a porous semiconductive structure.

2. A process according to claim 1, wherein, in step A, continuously,
   (a) at least one vaporous or gaseous semimetal hydride selected from silane, germanium hydride and a mixture of these semimetal hydrides and at least one vaporous or gaseous dopant, and an inert gas are transferred into a reactor and mixed there, the proportion of the semimetal hydride being from 0.1% to 90% by weight based on the sum of semimetal hydride, dopant and inert gas, and then
   (b) a plasma is obtained by energy input by means of electromagnetic radiation in the microwave range at a pressure of 10 to 1100 hPa, and then
   (c) the reaction mixture is allowed to cool, and the reaction product is removed from gaseous substances in the form of a powder to obtain predominantly crystalline doped semimetal particles.

3. A process according to claim 2, wherein in step (a), a dopant is used which is selected from lithium metal and lithium metal amide ($LiNH_2$), from the group of hydrogen-containing compounds of phosphorus, arsenic, antimony, bismuth, boron, aluminium, gallium, indium, thallium, europium, erbium, cerium, praseodymium, neodymium, samarium, gadolinium, terbium, dysprosium, holmium, thulium, ytterbium, lutetium, lithium, germanium, iron, ruthenium, osmium, cobalt, rhodium, iridium, nickel, palladium, platinum, copper, silver, gold, zinc, or from a mixture of these dopants.

4. A process according to any one of claims 1 to 3, wherein, in step B, doped semimetal particles are used with a proportion by mass of 1 to 60% by weight based on the total mass of the dispersion, and the doped semimetal particles are dispersed into a liquid phase which comprises water and/or at least one organic solvent to obtain a dispersion which, at 23° C., has a viscosity of less than 100 mPas at $1000\ s^{-1}$.

5. A process according to claim 1, wherein, in step C, the dispersion is applied to the substrate by spin-coating, knife-coating, drip-coating, screen-printing, dip-coating or spray-coating, and then the liquid phase is driven out by introducing thermal energy to obtain a layer which has a conductivity of at most $10^{-11}\ S \cdot cm^{-1}$.

6. A process according to claim 5, wherein a substrate is used which is selected from organic material, inorganic material, and a composite comprising at least one organic and/or at least one inorganic material, the substrate being resistant to hydrofluoric acid.

7. A process according to claim 1, wherein, in step D, a solution of hydrogen fluoride in water in a concentration of the hydrogen fluoride of 0.01% by weight to 50% by weight, based on the total mass of the solution of hydrogen fluoride in water, is applied by dipping, drip-coating, spray-coating or flow-coating, and is applied at a temperature of 10° C. to 70° C. and over a period of 1 s to 1 hour to obtain a layer which has a conductivity of $5 \cdot 10^{-11}\ S \cdot cm^{-1}$ to $2 \cdot 10^{-10}\ S \cdot cm^{-1}$.

8. A process according to claim 1, wherein the layer obtained after step D, in a further step before step E, is dipped or rinsed off in water and then blown with dry nitrogen, or then dried at a temperature of 60 to 200° C.

9. A process according to claim 1, wherein the thermal treatment is effected in step E by introducing thermal energy with a power density of $10\ kW \cdot cm^{-2}$ to $65\ MW \cdot cm^{-2}$, which at least partly sinters the particles of the layer obtained after step D.

10. A process according to claim 9, wherein the input of thermal energy is effected by laser light having a wavelength of 500 to 1100 nm, the thermal energy being introduced with an energy density of $1\ mJ \cdot cm^{-2}$ to $500\ mJ \cdot cm^{-2}$, wherein the laser light is optionally pulsed laser light, said pulsed laser light being used with a pulse duration of 8 ns to 20 ns and a pulse frequency of 10 to 30 pulses at a pulse repetition rate of 0.01 to $10 \cdot s^{-1}$.

11. A porous semiconductor structure which is obtained according to claim 1.

12. A process according to claim 4, wherein said viscosity is less than 10 mPas at $1000\ s^{-1}$.

13. A process according to claim 10, wherein the laser light is pulsed laser light.

* * * * *